US006983435B2

(12) United States Patent
Baumgartner et al.

(10) Patent No.: US 6,983,435 B2
(45) Date of Patent: Jan. 3, 2006

(54) INTEGRATED DESIGN VERIFICATION AND DESIGN SIMPLIFICATION SYSTEM

(75) Inventors: Jason Raymond Baumgartner, Austin, TX (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 371 days.

(21) Appl. No.: 10/464,883

(22) Filed: Jun. 19, 2003

(65) Prior Publication Data

US 2004/0261043 A1    Dec. 23, 2004

(51) Int. Cl.
G06F 17/50 (2006.01)
G06F 9/45 (2006.01)
(52) U.S. Cl. .................. 716/5; 716/4; 716/1
(58) Field of Classification Search .............. 716/4, 716/1, 5
See application file for complete search history.

(56) References Cited

U.S. PATENT DOCUMENTS

| | | | | |
|---|---|---|---|---|
| 5,483,470 A * | 1/1996 | Alur et al. | ...................... | 716/6 |
| 6,102,959 A * | 8/2000 | Hardin et al. | ................... | 703/2 |
| 6,185,516 B1 * | 2/2001 | Hardin et al. | ................... | 703/2 |
| 6,470,481 B2 * | 10/2002 | Brouhard et al. | .............. | 716/5 |
| 6,484,134 B1 * | 11/2002 | Hoskote | ...................... | 703/14 |
| 6,499,132 B1 * | 12/2002 | Morley et al. | ................. | 716/5 |
| 6,523,153 B1 * | 2/2003 | Takemura et al. | .............. | 716/5 |
| 6,553,514 B1 * | 4/2003 | Baumgartner et al. | ........ | 714/32 |
| 6,687,662 B1 * | 2/2004 | McNamara et al. | .......... | 703/14 |
| 2002/0046391 A1 * | 4/2002 | Ito et al. | ....................... | 716/18 |
| 2003/0018945 A1 * | 1/2003 | Foster et al. | .................... | 716/5 |
| 2003/0083858 A1 * | 5/2003 | Musliner et al. | .............. | 703/22 |
| 2004/0049371 A1 * | 3/2004 | Fraer et al. | ................... | 703/14 |
| 2004/0123254 A1 * | 6/2004 | Geist et al. | .................... | 716/4 |
| 2004/0153983 A1 * | 8/2004 | McMillan | ...................... | 716/5 |
| 2004/0168137 A1 * | 8/2004 | Baumgartner et al. | ........ | 716/5 |
| 2005/0102596 A1 * | 5/2005 | Hekmatpour | ............... | 714/741 |

* cited by examiner

Primary Examiner—Stacy A. Whitmore
Assistant Examiner—Magid Y. Dimyan
(74) Attorney, Agent, or Firm—Joseph P. Lally; Casimer K. Salys

(57) ABSTRACT

A design model verification method includes performing under approximation (UAV) processing to potentially resolve a defined verification problem and to identify a set of reachable states for the design model. If UAV processing fails to resolve the defined verification problem, coverage data extracted from the UAV processing is evaluated to identify new candidates for design model simplification and to disprove previously identified simplification candidates. Over approximation verification (OAV) processing is performed to potentially resolve the verification problem and to prove one or more previously identified simplification candidates. If the OAV processing fails to resolve the verification problem, the design model is simplified using any proven simplification candidates and any states that disproved a previously identified simplification candidate are stored to use a seed state for subsequent UAV processing.

22 Claims, 4 Drawing Sheets

| STATES ENCOUNTERED 502 | TOGGLE ACTIVITY DATA 504 | | | | | |
|---|---|---|---|---|---|---|
| S1, S2, S5, ..... SN | G1<br>G2<br>G3<br>.<br>.<br>.<br>GN | 0<br>135<br>135<br>.<br>.<br>.<br>1728 | | | | |

INTEGRATED DESIGN VERIFICATION AND DESIGN SIMPLIFICATION SYSTEM

BACKGROUND

1. Field of the Present Invention

The present invention relates to the field of integrated circuit design and more particularly to the field of integrated circuit design verification systems.

2. History of Related Art

As the complexity of microprocessors and other integrated circuits has increased over the years, the resources devoted to design verification have accounted for an increasingly large percentage of the total resources required to develop and manufacture such a device. Indeed, verifying an advanced microprocessor having multiprocessing capability is now estimated to consume more time, labor, and other resources than designing it.

Historically, functional verification primarily consisted of generating large numbers of test programs or test cases and running those test programs on a simulator that modeled the device operation. Designers and verification engineers frequently developed such test cases manually with the help of various random and specific test generators. As the number of transistors, functions, registers, and other facilities in the integrated circuit has increased, conventional verification methods have responded by simply increasing the number of tests that are simulated. Unfortunately, generating a seemingly infinite number of tests is an inefficient and unreliable method of verifying the functionality of all components in a complex circuit.

In the early days of microprocessor development, inefficiencies in functional verification were tolerated because the size of the test space (measured, for example, by the number of states the microprocessor may assume) was sufficiently small. In addition, early microprocessors typically had fewer functional units than modern microprocessors, and the interactions between the components and functions were well understood and controlled. The increasing number of functional units in microprocessors is significant from a verification perspective because interaction between functional units can no longer be ignored or only loosely verified by conventional verification methodologies.

The diverse applications in which modern integrated circuits are employed makes it impossible to predict and plan for the type of software applications that will run on them and thus the state and interdependence that will be exercised in the field are rather large and generally non-deterministic. Roughly speaking, the test space of a microprocessor is approximately equal to $2^n$ where n represents the number of latches (state storage devices) within the microprocessor. From this approximation, it will be appreciated that the test space of microprocessors increases exponentially as the number of latches is increased.

The conventional approach to functional verification, in which increased complexity in a device is addressed by simply increasing the number of tests that are simulated, is rapidly becoming infeasible. In addition, because the input to a simulator in a conventional verification process is simply a large number of deterministic tests or randomly generated tests, the output of the simulation must be painstakingly evaluated to determine whether a particular simulation was successful in testing the intended functionality of the device. It would be desirable to implement a test verification system that improved the efficiency of the design verification process.

SUMMARY OF THE INVENTION

The goal identified above is achieved by a system and method for verifying the functionality of an integrated circuit according to the present invention. An iterative process is pursued in which under approximation verification and over approximation verification techniques are performed in conjunction with one another. In addition to determining whether a particular test objective, such as the assertion of a CHECKSTOP signal indicating a functionality problem, is achieved, functional coverage information obtained during each iteration of verification processing is used to identify candidates or "lighthouses" for simplifying the design model. These lighthouses are then added to the design model and monitored in the same way that the CHECKSTOP signal is monitored. After each iteration, verification results are analyzed to determine if any lighthouse has been definitely proven such that the appropriate simplification can occur. If disproven, the lighthouses are used to guide subsequent iterations of the verification processing into previously unexplored areas of the circuit model's functionality. The integration of dual verification processes with the simplification process and the use of lighthouse behavior to guide the verification task results in a highly efficient functional verification process.

BRIEF DESCRIPTION OF THE DRAWINGS

Other objects and advantages of the invention will become apparent upon reading the following detailed description and upon reference to the accompanying drawings in which.

Figure 1:
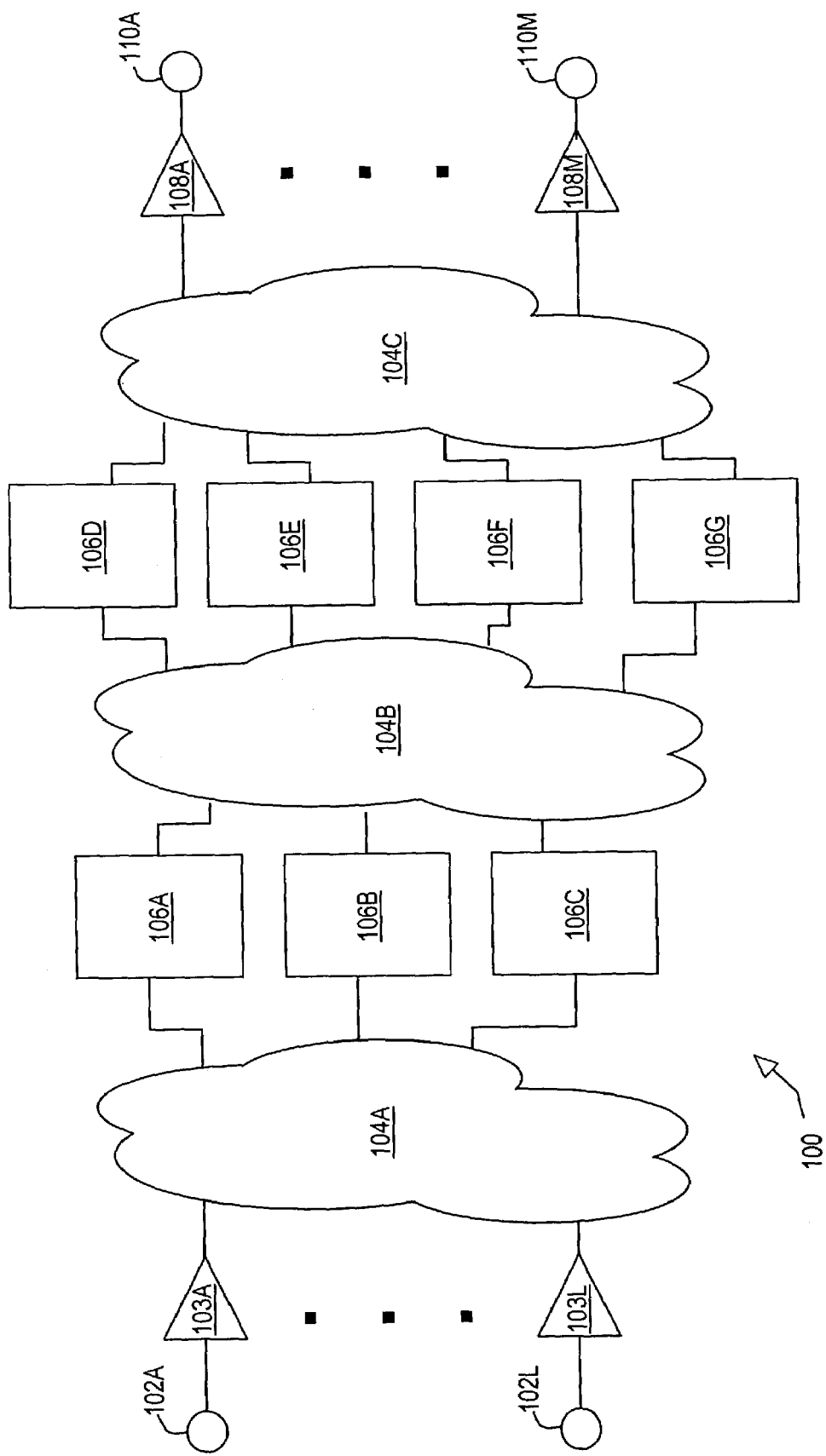
FIG. 1 is a block diagram of selected elements of an integrated circuit design.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Generally speaking, the present invention entails a system and method for verifying the functionality of an integrated circuit. An iterative process is pursued in which under approximation verification and over approximation verification techniques are performed. In addition to determining whether a particular test objective, such as the assertion of a CHECKSTOP signal indicating a functionality problem, is achieved, functional coverage information obtained during each iteration is used to identify candidates or "lighthouses" for simplifying the design model. These lighthouses are then added to the design model and monitored in the same way that the CHECKSTOP signal is monitored. After each iteration, verification results are analyzed to determine if any lighthouse has been definitely proven such that the appropriate simplification can occur. In addition, the observed behavior of these lighthouses is used to guide subsequent iterations of the verification into previously unexplored areas of the design model's functionality. The integration of the verification processes with the simplification process and the use of lighthouse behavior to guide the verification results in a highly efficient functional verification process.

Referring now to the drawings, FIG. 1 depicts selected elements of an exemplary integrated circuit 100 suitable for use in conjunction with the present invention. In the depicted example, integrated circuit 100 is shown as an arrangement of inputs, buffers, combinational logic, state holding elements (latches), drivers, and outputs to emphasize the elements of an integrated circuit design model that are significant for purposes of verification. Specifically, integrated circuit 100 is shown as including a set of L inputs 102A through 102L (generically or collectively referred to herein as input(s) 102), each connected to a corresponding buffer 103A through 103L (buffer(s) 103). The inputs 102, through their respective buffers 103, are connected to combinational logic 104A. Combinational logic 104A represents any collection and arrangement of logic elements including, as examples, AND, NAND, OR, NOR, and XOR gates. Combinational logic 104A drives the inputs to latches 106A through 106C, the outputs of which drive combination logic 104B. Combinational logic 104B drives a bank of latches 106D through 106F, which provide inputs to combinational logic 104C, output buffers 108A through 108M and, ultimately, output signals 110A through 110M.

The elements of combinational logic are not state holding elements in the sense that their outputs change substantially instantly in response to changes to their inputs. The elements of combinational logic 104A are contrasted with the latches 106A through 106G (generically or collectively referred to herein as latch(s) 106) depicted in FIG. 1, which are clocked elements (although the clock input is not shown explicitly in an attempt to maintain clarity). The outputs of latches 106 are static with respect to the corresponding input except during well-defined timing events such as a transition of the clock signal. Because latches 106 retain their output values after the input signal that produced the output has changed, latches are referred to as state holding elements. The combinational logic elements 104A through 104C are typically designed to operate faster than the clock signal that drives latches 106. In this manner, output transitions of latches 106A through 106C, which occur following a clock signal transition, are propagated to the inputs of latches 106D to through 106G before the next clock signal transition occurs.

Integrated circuit 100 is referred to as a state machine because it is capable of assuming only a finite (albeit very large) number of states. The state machine transitions from one state to the next based on the state of the inputs 102 during each clock transition. During any clock cycle, the state of integrated circuit 100 is completely described by, the values of inputs 102, the state of latches 106, which are most typically binary devices capable of assuming one of two states (1 or 0, HI or LO, asserted or non-asserted, etc.), and the values of outputs 110. Thus, for the depicted example of integrated circuit 100 having "G" latches 106, the integrated circuit may theoretically assume or occupy any of $2^G$ states. It will be appreciated that the theoretical state space of a very large scale integrated circuit having millions of such latches is enormous and impossible to verify completely. Design verification of a complex integrated circuit is, therefore, only an approximation. The present invention incorporates verification techniques to improve approximation by optimizing the efficiency with which the process exercises the reachable states of the design.

The present invention makes use of two fundamentally different verification techniques to achieve efficient and integrated verification and simplification. These two verification techniques are referred to herein as under-approximation verification (UAV) and over-approximation verification (OAV). Exemplary UAV processes include any form of random simulation algorithm and/or bounded model checking. Bounded model checking refers to a verification process in which all states reachable from an initial state are enumerated for a predetermined number of time steps. If a defined test condition (such as the assertion of a CHECK STOP signal) is reached, the verification problem is resolved.

Figure 2:
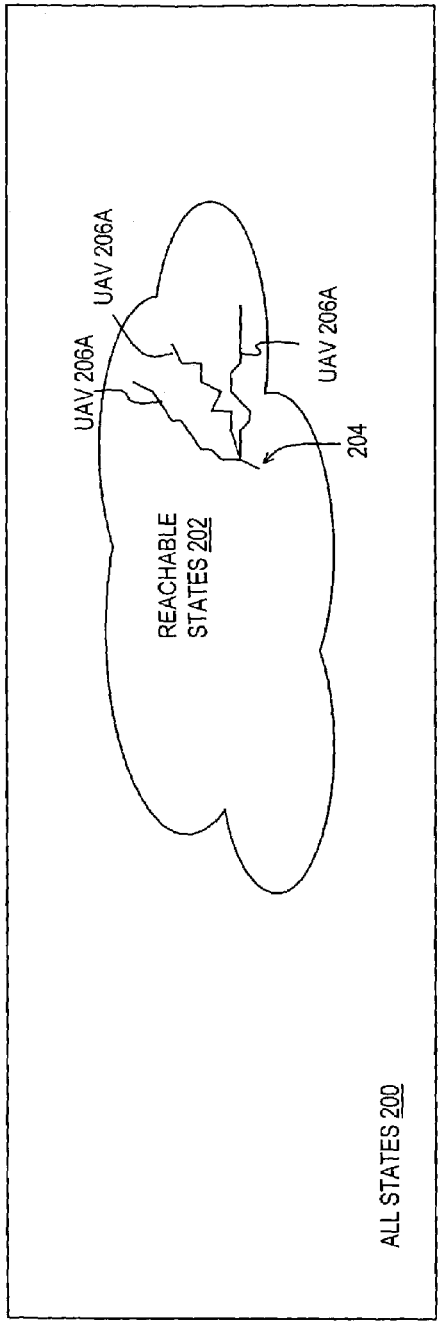
FIG. 2 is a conceptual illustration of the theoretical state space and reachable state space of the integrated circuit design of FIG. 1 emphasizing a conceptual representation of an under approximation verification process.

Referring now to FIG. 2, a conceptual representation of the state space of integrated circuit 100 is depicted to emphasize characteristics of such UAV process. In this illustration, the set of theoretically achievable states for integrated circuit 100 is represented by reference numeral 200 while the set of reachable states is represented by reference numeral 202. Because every latch in an integrated circuit is capable of assuming either of two states, the size of the theoretical state space 200 is $2^N$ where N is the number of latches. As the latches and intervening combinational logic are arranged in the integrated circuit, however, there are many states that are unobtainable. An unobtainable or unreachable state means that there is no initial state and input sequence combination that will produce the state. Because many states are unreachable, the set of reachable states, represented by reference numeral 202, is a subset of the theoretical states 200.

In the depicted UAV process, an initial state or "seed" state 204, which is known to be in the reachable state set 202, is established and a sequence of input vectors is then applied to the integrated circuit model with each vector representing a clock cycle or time step. In this fashion, a sequence of states is simulated, with a separate state corresponding to each input vector. Three such UAV state sequences are represented in FIG. 2 by reference numerals 206A, 206B, and 206C. Because the initial state 204 is known to be within the reachable state set 202 and because legal or permissible input vectors have been applied to the device, each state encountered during the UAV process is within the reachable state set 202. This is desirable because complete functional verification is only achievable if all states in reachable state set 202 are exposed. Even if complete verification is not feasible because of the huge number of latches, adequate functional coverage still requires the exposure of as many reachable states as possible within the constraints of time and expense. Thus, a UAV process is desirable for its ability to expose reachable states. Moreover, if a test condition such as the assertion of a defined CHECKSTOP signal, happens to be achieved during a UAV process, the test condition is unambiguously satisfied and the verification problem is resolved. For example, the assertion of a CHECKSTOP signal during a UAV process proves conclusively that there is at least one way to achieve the test condition. The primary limitation of a UAV process is limited functional coverage. A very large number of UAV iterations must be performed to achieve even moderate functional coverage of a device because, as conceptually depicted in FIG. 2, each UAV state sequence 206 is only able to encounter a single "path" of states.

In contrast to a UAV process, an OAV process performs "overly complete" state enumeration because it does not confine itself to the set of reachable states 202. If a particular condition is exposed by an OAV process, the condition does not necessarily implicate behavior of the actual device unless it can be determined that the base state from which the condition was produced is a reachable state. An exemplary OAV process is a k-step induction process, where k is an integer greater than or equal to 1. A 1-step induction process includes two steps, namely, a base case step and an inductive step. In the base case step, the process validates that the CHECKSTOP cannot be asserted in the initial state(s) of the design. In the inductive step, the process seeds the design into all states STATE(0) that do not assert CHECKSTOP. Note that the states in STATE(0) are not necessarily reachable states. The process then determines whether the set of states STATE(1) reachable in one step from STATE(0) includes any states with CHECKSTOP asserted. If there are no states in STATE(1) with CHECKSTOP asserted, then the test conclusively demonstrates that CHECKSTOP is unreachable thereby resolving the verification problem. If there are states in STATE(1) with CHECKSTOP asserted, then the process is generally inconclusive because it is generally not known whether the particular state in STATE(0) that produced the asserted CHECKSTOP in STATE(1) is itself a reachable state.

Figure 3:
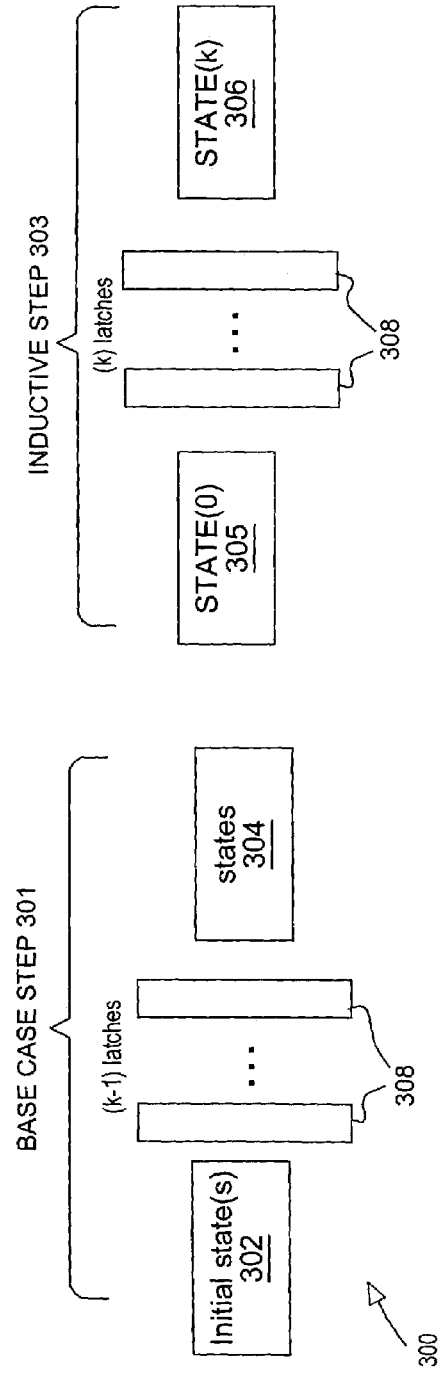
FIG. 3 is a conceptual depiction of an over approximation verification process.

More generally, a k-step induction process 300 as depicted in FIG. 3 includes two parts. In the base case step 301, process 300 validates that CHECKSTOP cannot be asserted in any of a set of initial states 302, nor in any of a set of states 304 reachable within k-1 steps (represented by latches 308) from initial states 302. In the inductive step 303, process 300 then seeds the design into all possible states STATE(0) 305 from which CHECKSTOP cannot be asserted within 0 through (k-1) time steps and determines whether the set of states STATE(k) 306 reachable in k steps from STATE(0) includes any states with CHECKSTOP asserted. If there are no such states in STATE(k), then the process conclusively demonstrates that CHECKSTOP is unreachable. As k increases, the inductive process is more likely to reach a conclusive result because the set of initial states STATE(0) decreases as k increases.

Whereas a UAV process is determinative if it uncovers a defined condition and inconclusive if it does not produce the condition, an OAV process is determinative if it establishes that the condition cannot occur and inconclusive if it discovers a base state from which the condition can be produced if it is not known whether the base state is a reachable state. The present invention employs UAV and OAV techniques in combination to facilitate efficient coverage of the reachable state set 202. As part of this efficient coverage technique, the invention also uses the combination UAV/OAV to identify candidates for circuit model simplification and, when circuit model simplification is not possible, to guide subsequent verification efforts into previously unexplored behavior of the circuit.

Simplification refers to techniques in which one or more latches or gates in the integrated circuit model are effectively eliminated to reduce the number of latches requiring verification and thereby beneficially reducing the state space or to reduce the number of combinational logic gates thereby simplifying the verification algorithm. The most common examples of simplification occur when a particular latch or gate generates a constant value and when the two or more latches (or gates) appear always to toggle together. In the case of a constant value latch/gate, the latch/gate can be replaced with the constant value in the circuit model and removed as a variable in the verification process, thereby halving the theoretical state space of the model (in the case of a replaced latch). Similarly, when two or more latches/gates are acting in concert, they can be merged to reduce the latch/gate count. The invention improves verification and simplification efforts by using a UAV process to identify and attempt to disprove simplification candidates and an OAV process to confirm the simplification candidates. If a simplification candidate is proven, circuit simplification follows as a result. If the candidate is disproven, the state or states that disproved the candidate are used to guide subsequent UAV iterations into previously unexplored regions of the reachable state set.

Portions of the invention may be implemented as a sequence or set of computer executable instructions (software) stored on a computer readable medium such as a hard disk, floppy diskette, CD ROM, flash memory or other electrically erasable device, ROM and so forth. During periods when the instructions are being executed by a computer, the executable instructions may reside in volatile storage including the computer's system memory (DRAM) or one or more levels of cache memory (SRAM).

Figure 4:
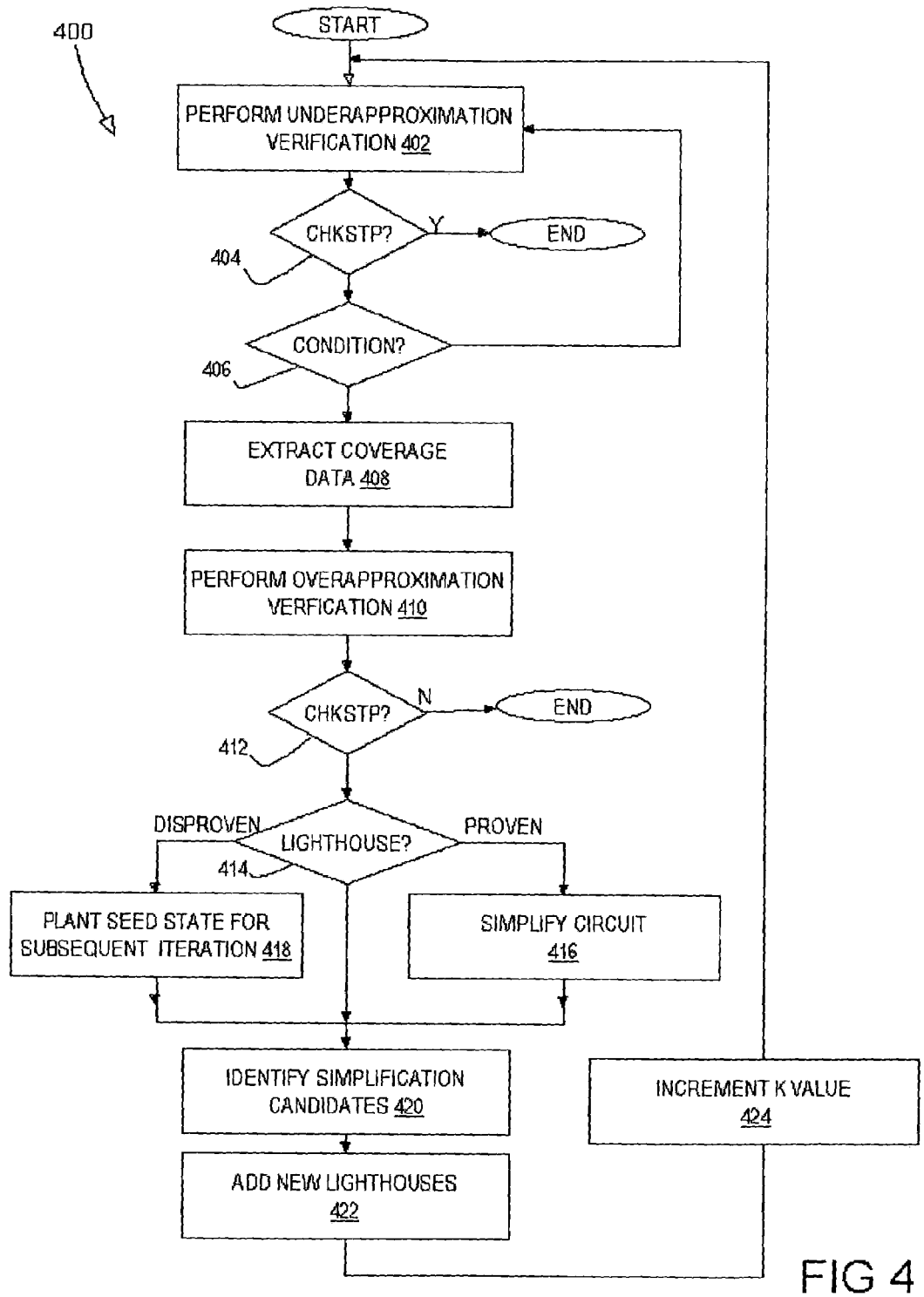
FIG. 4 is a flow diagram of a design verification process according to one embodiment of the present invention.

Referring now to FIG. 4, a flow diagram illustrates a design verification process 400 according to one embodiment of the present invention. In the depicted embodiment, verification process 400 is initiated by performing (block 402) a UAV process to attempt to encounter the assertion of a defined CHECKSTOP signal, to expose as many reachable states as possible, and to extract the resulting coverage data. An initial state is imposed upon the circuit model. The initial state is likely defined by the circuit designer as a known reachable state. The state of the circuit following a power-on reset sequence, for example, is an initial state that may be used for the UAV process.

If the CHECKSTOP signal is asserted (block 404), the verification problem is unambiguously resolved because a state that is known to be reachable produces an asserted CHECKSTOP. It should be noted that while the flow diagram of FIG. 4 is described with respect to a single CHECKSTOP signal, it is understood that there may well be multiple CHECKSTOP signals each corresponding to different error conditions. In such a case, the verification would terminate only if all such CHECKSTOP signals are resolved during the UAV process.

Assuming that the CHECKSTOP signal remains unresolved after performing the UAV process, the depicted embodiment may perform additional UAV processing. In one example, UAV processing 402 represents random simulation processing. In another embodiment, UAV processing may represent bounded model checking, or a combination of simulation and bounded model checking. After each iteration of UAV processing 402, the depicted embodiment of verification process 400 determines whether some predefined constraint or condition 406 has been exceeded. The predefined constraint could be a simple time constraint in which random simulation runs are performed for a predetermined amount of time or it could be the number of cycles for which random simulation will be performed. In another example, UAV processing may terminate when it appears that the functional coverage being achieved is saturating such that fewer new states are being uncovered with each iteration.

Figures 5, 6A, 6B:
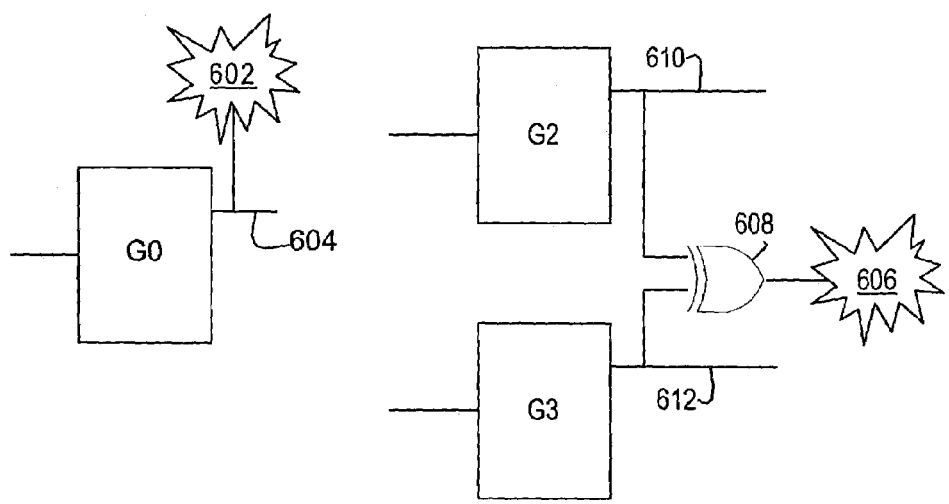
FIG. 5 illustrates selected functional coverage information obtained during an under approximation verification process.
FIGS. 6A and 6B illustrate the use of the coverage information of FIG. 5 to add and monitor "lighthouse" nets for suspected constant gates and latches and equivalent gates and latches as a method of simplifying and guiding subsequent verification processing.

This determination may be made in conjunction with the extraction (block 408) of coverage data following UAV processing. Referring momentarily to FIG. 5, a conceptual representation of coverage data 500 maintained by one embodiment of the verification system is shown. In the depicted example, coverage data 500 includes the set of states that have been encountered 502 during UAV processing. The encountered states information 502 defines the set of states known to be within reachable state set 202 (FIG. 2). In addition to encountered states information 502, the depicted embodiment of coverage data 500 includes information about the activity of each individual latch. More specifically, the depicted embodiment of coverage data 500 maintains toggle activity data 504 that indicates the number of times each individual latch toggled during UAV processing. As further described below, toggle activity data 504 is useful in facilitating circuit model simplification efforts.

Returning to FIG. 4, if at least one CHECKSTOP signal remains unresolved following UAV processing 402 and additional UAV processing is prevented by a time constraint, functional coverage saturation, or other condition, functional coverage data above corresponding to the UAV processing is extracted (block 408). An OAV process is then performed (block 410). In one embodiment, OAV processing 410 includes k-step induction processing where the value of "k" is 1 initially and is incremented during subsequent iterations. Thus, during a first pass, the value of k is set to 1 and a 1-step induction process is performed. In this embodiment, the OAV processing proceeds until the induction process terminates or until a time constraint or other resource constraint is exceeded. If, in block 412, the OAV processing terminates successfully (i.e., none of states in the fully enumerated set of states STATE(1) (as described above) produce an asserted CHECKSTOP signal), then OAV processing 410 has conclusively resolved the verification problem by proving that the CHECKSTOP signal cannot be asserted under any condition and verification can, therefore, terminate. Again, if multiple CHECKSTOP signals are defined, verification processing continues until all such signals are resolved. It is noted that in blocks 404 and 412, verification resolution is based on opposing conclusions. In other words, UAV processing is conclusive if the CHECKSTOP signal is asserted whereas OAV processing is conclusive if the CHECKSTOP signal is not asserted.

Assuming the OAV processing 410 completes without resolving at least one CHECKSTOP signal, the depicted embodiment of verification process 400 then determines (block 414) whether any previously defined "lighthouses" have been resolved. A lighthouse is analogous to a CHECKSTOP signal, but refers to a secondary task or condition not corresponding to an error condition, but of interest to the verification process nevertheless. More specifically in the context of the present invention, the lighthouses reflect possible redundancy within the circuit model.

If a previously defined lighthouse has been conclusively resolved during UAV processing 402 (i.e., the lighthouse was asserted thereby disproving the suspected redundancy), or during OAV processing 410 (i.e., the light was proven to be incapable of being asserted thereby proving the suspected redundancy), appropriate action is taken. If the lighthouse was proven during the verification processing, the circuit model is simplified (block 416) by replacing constant value latches or gates with their corresponding constants, merging equivalent latches or gates, and/or performing any other simplification indicated by the lighthouse. If, on the other hand, a lighthouse was disproven during UAV processing, then the state(s) that disproved the lighthouse is stored to be used as a seed state for subsequent UAV processing. This technique beneficially guides subsequent UAV processing into previously unexplored areas of the reachable state set 202. Lighthouses (as described further below) correspond to latches suspected of being redundant because, for example, they showed constant behavior (single latch redundancy) or equivalent behavior (multiple latch redundancy) during previous verification processing. Any state sequence that disproves a lighthouse is of interest because it indicates functional behavior that has not yet been exposed and therefore indicates possible states from which to initiate subsequent verification efforts.

Following the evaluation of any existing lighthouses, the depicted embodiment of verification process 400 then identifies (block 420) latches that are candidates for circuit model simplification. These candidates may be identified by referring to the toggle activity data 504 described above with respect to FIG. 5. More specifically, because toggle activity data 504 indicates the number of transitions of the corresponding latch's output signal, this information can be used to identify latches that exhibit constant behavior and equivalent behavior. Constant behavior candidate latches include any latch that shows 0 toggle activity during verification processing while equivalent behavior candidates include any set of latches that experienced the same number of (nonzero) toggles. In the illustrated example, therefore, latch G1 is a candidate for constant behavior while latches G2 and G3 are candidates for equivalent behavior.

After determining the latches that are candidates for future simplification, lighthouses for each such candidate are constructed (block 422) in the circuit model. Referring to FIG. 6A and FIG. 6B, a lighthouse 602 is constructed for a constant latch candidate G0 by adding the state of net 604 as a monitored condition or event. FIG. 6B shows the construction of a lighthouse 606 for a pair of equivalent latch candidates G2 and G3. In this case, an XOR gate 608 is added to the circuit model. The inputs of XOR latch 608 are connected to output node nets 610 and 612 of G2 and G3 respectively. The lighthouse 606 represents the monitored output net of XOR latch 608. Lighthouse 606 will be asserted only if latches G2 and G3 produce different values during verification processing. It should be noted that equivalent behavior encompasses latches that toggle with each other but have complementary values. In this case, a lighthouse can be constructed by inverting one of the latch's output signals.

After constructing any new lighthouses in block 422, the depicted embodiment of verification processing 400 is continued by incrementing k (k-step induction) (block 424), returning to UAV processing 402 and repeating the processing described above. In this manner, UAV and OAV processing are performed in conjunction with each other and in conjunction with redundancy checking to achieve highly integrated verification and simplification. Simplification efforts are now focused upon latches/gates are suspected of being redundant based on the actual verification processing such that effort is not wasted attempting to prove that a latch/gate observed to toggle during verification processing is constant or that two latches/gates observed during verification processing to differ are equivalent. Moreover, simplification candidates, if ultimately disproven, are nevertheless used to guide the verification processing into productive areas thereby increasing the probability of exposing a CHECKSTOP during UAV processing.

It will be apparent to those skilled in the art having the benefit of this disclosure that the present invention contemplates a method and system for verifying the design of an integrated circuit. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. An integrated design verification process, comprising:
performing under approximation verification (UAV) processing using a design model of the integrated circuit;
extracting and storing coverage data generated by the UAV process;
responsive to the UAV processing failing to resolve a verification problem, performing over approximation verification (OAV) processing on the design model;
responsive to the OAV processing failing to resolve the verification problem, evaluating a previously defined lighthouse, wherein the lighthouse is indicative of a defined state being achieved during the verification processing; and
responsive to a lighthouse being disproven, storing at least one state disproving the lighthouse to use as a seed state for subsequent UAV processing and, responsive to a lighthouse being proven, simplifying the design model before subsequent verification processing by eliminating at least one latch from the design model.

2. The process of claim 1, wherein performing the UAV process includes performing random simulation of the design model.

3. The process of claim 2, wherein performing the process further includes performing bounded model checking of the design model.

4. The process of claim 1, wherein performing the UAV processing is further characterized as performing UAV processing until either the verification problem is resolved or a resource constraint is exceeded.

5. The process of claim 1, wherein extracting coverage data is further characterized as extracting states encountered data and toggle activity data, wherein the toggle activity data indicates the number of times a corresponding latch in the design model toggled.

6. The process of claim 1, wherein the OAV processing includes k-step inductive processing wherein the value of k is incremented during each iteration of OAV processing.

7. The process of claim 1, wherein evaluating a previously defined lighthouse is further characterized as evaluating a previously defined lighthouse, wherein the lighthouse is indicative of potential simplification within the design model.

8. The process of claim 7, wherein the potential simplification includes potentially constant latches and potentially redundant latches.

9. The process of claim 8, wherein simplifying the design model includes replacing proven constants latches and merging proven redundant latches.

10. A computer program product comprising computer executable instructions for performing integrated design verification, the instructions being stored on a computer readable medium, comprising:
computer code means for performing under approximation verification (UAV) processing using a design model of the integrated circuit;
computer code means for extracting and storing coverage data generated by the UAV process;
computer code means, responsive to the UAV processing failing to resolve a verification problem, for performing over approximation verification (OAV) processing on the design model;
computer code means, responsive to the OAV processing failing to resolve the verification problem, for evaluating a previously defined lighthouse, wherein the lighthouse is indicative of a defined state being achieved during the verification processing; and
computer code means, responsive to a lighthouse being disproven, for storing at least one state disproving the lighthouse to use as a seed state for subsequent UAV processing and, responsive to a lighthouse being proven, for simplifying the design model before subsequent verification processing by eliminating at least one latch from the design model.

11. The computer program product of claim 10, wherein performing the UAV process includes performing random simulation of the design model.

12. The computer program product of claim 11, wherein performing the UAV process further includes performing bounded model checking of the design model.

13. The computer program product of claim 10, wherein performing the UAV processing is further characterized as performing UAV processing until either the verification problem is resolved or a resource constraint is exceeded.

14. The computer program product of claim 10, wherein extracting coverage data is further characterized as extracting states encountered data and toggle activity data, wherein the toggle activity data indicates the number of times a corresponding latch in the design model toggled.

15. The computer program product of claim 10, wherein the OAV processing includes k-step inductive processing wherein the value of k is incremented during each iteration of OAV processing.

16. The computer program product of claim 10, wherein evaluating a previously defined lighthouse is further characterized as evaluating a previously defined lighthouse, wherein the lighthouse is indicative of potential simplification within the design model.

17. The computer program product of claim 16, wherein the potential simplification includes potentially constant latches and potentially redundant latches.

18. The computer program product of claim 17, wherein simplifying the design model includes replacing proven constants latches and merging proven redundant latches.

19. A design model verification process, comprising:
performing under approximation (UAV) processing to potentially resolve a defined verification problem and to identify a set of reachable states for the design model;
responsive to the UAV processing failing to resolve the defined verification problem, evaluating toggle activity data extracted from the UAV processing to identify new candidates for design model simplification and to disprove previously identified simplification candidates;
performing over approximation verification (OAV) processing to potentially resolve the verification problem and to prove one or more previously identified simplification candidates; and
responsive to the OAV processing failing to resolve the verification problem, simplifying the design model using any proven simplification candidates and storing any states that disproved a previously identified sim plification candidate to use a seed state for subsequent UAV processing.

20. The process of claim 19, wherein identifying new simplification candidates is further characterized as identifying potentially constant value latches and identifying potentially redundant latches in the design model.

21. The process of claim 19, wherein the UAV processing includes random simulation and bounded model checking and further wherein the OAV processing includes k-step inductive processing wherein the value of k is incremented during each subsequent iteration of OAV processing.

22. The process of claim 20, wherein identifying potentially constant value latches is further characterized as identifying latches exhibiting zero toggle activity and wherein identifying potentially redundant latches is further characterized as identifying at least two latches exhibiting equal toggle activity.

* * * * *